United States Patent
Chen et al.

[11] Patent Number: 5,861,643
[45] Date of Patent: Jan. 19, 1999

[54] SELF-ALIGNED JFET

[75] Inventors: Tony Wei Chen, Singapore, Singapore; Ravishankar Sundaresan, Plano, Tex.

[73] Assignee: Chartered Semiconductor Manufacturing, Ltd., Singapore, Singapore

[21] Appl. No.: 933,961

[22] Filed: Sep. 19, 1997

Related U.S. Application Data

[62] Division of Ser. No. 703,079, Aug. 26, 1996, Pat. No. 5,702,987.

[51] Int. Cl.⁶ .................................................... H01L 29/80
[52] U.S. Cl. ............................................ 257/256; 257/263
[58] Field of Search ...................................... 257/263, 256

[56] References Cited

U.S. PATENT DOCUMENTS 5,243,209  9/1993  Ishii ........................................ 257/263
5,294,814  3/1994  Das ........................................... 257/77

FOREIGN PATENT DOCUMENTS 2026237  1/1980  United Kingdom .................... 257/263

*Primary Examiner*—Mark V. Prenty
*Attorney, Agent, or Firm*—George O. Saile; Stephen B. Ackerman; Graham S. Jones, II

[57] ABSTRACT

A JFET device is formed on a semiconductor body comprising an active region for the junction field effect device. A drain region layer is formed below the lower portion of the active region. The top surface of the body is doped to provide a source region layer on the device. Gate trenches extend through the source region layer forming source regions therein. The gate trenches also extend partially through the epitaxial layer. The gate trenches have sidewalls and bottoms. Dielectric spacer layers cover the sidewalls of the gate trenches upon surfaces of the source layer and the epitaxial layer in the gate trenches. Self-aligned gate regions are formed at the bottoms of the gate trenches in doped portions of the active region.

20 Claims, 4 Drawing Sheets

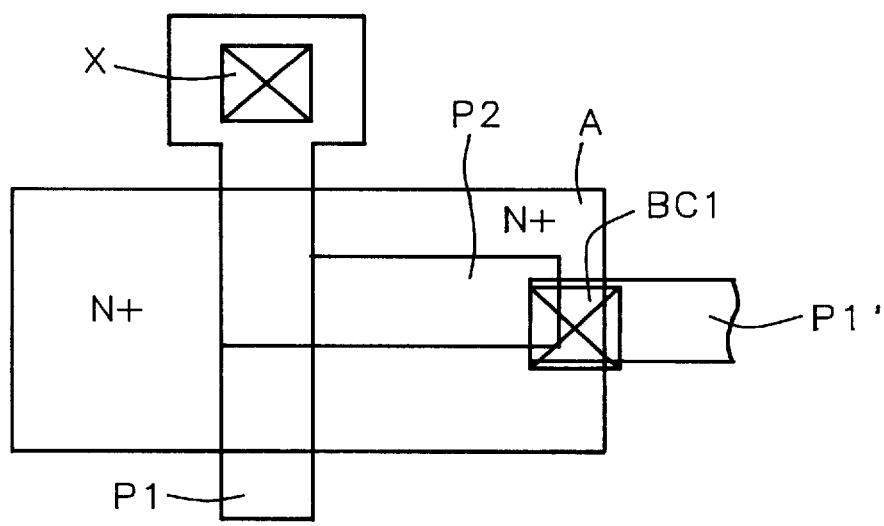
*FIG. 2*
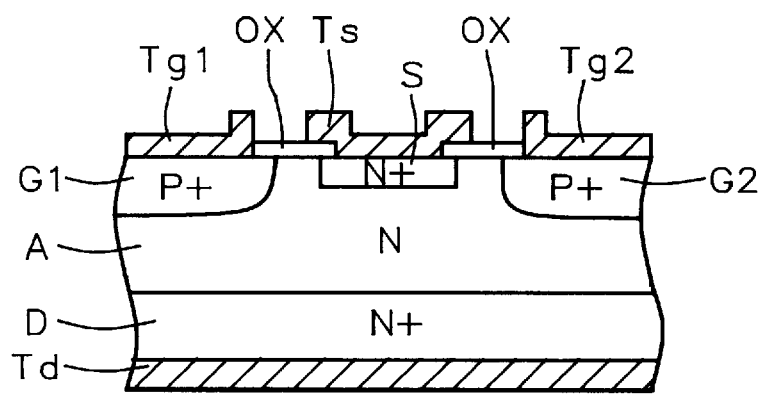
*FIG. 3 - Prior Art*

SELF-ALIGNED JFET

This is a division of patent application Ser. No. 08/703079, filing date Aug. 26, 1996, Self-Aligned JFET And Method Of Manufacture Thereof, assigned to the same assignee as the present invention and now U.S. Pat. No. 5,702,987.

BACKGROUND OF THE INVENTION

1. Field of the Invention

This invention relates to junction field effect transistors and more particularly to a modified architecture and method of manufacture thereof.

2. Description of Related Art

A junction field-effect transistor (JFET) is unipolar device with a source electrode, a drain electrode, and at least one gate electrode which uses the depletion region of one or more reverse-biased P–N junctions to modulate the cross-sectional area available for current flow. The current is due to carriers of one polarity only. A JFET consists of a conductive channel with two ohmic contacts, one acting as the source and the other as the drain. When a positive voltage is applied to the drain with respect to the source, electrons flow from the source to the drain. The third electrode, the gate electrode(s), form(s) a rectifying junction with the channel.

FIG. 3 shows a prior art surface gate JFET with semiconductor substrate with an N doped active region A formed above an N+ drain region D. In the substrate are formed N+ gate regions G1 and G2 near the sides of source region S. Above the gate regions G1 and G2 are formed gate electrodes Tg1 and Tg2. Above the periphery of the gate regions G1 and G2 is formed an oxide dielectric layer OX with an opening therethrough with a source electrode Ts extending down to contact the source region S of the JFET. A problem is that source region S is formed between and narrowly separated from the gate regions G1 and G2. Dielectric layer OX isolates the source electrode Ts from the gate regions G1 and G2 and gate electrodes Tg1 and Tg2.

To fabricate a prior art surface gate JFET of the kind seen in FIG. 3, two critical lithography steps are required. The source region S must be aligned between the diffused gate regions G1 and G2 and the contact windows must be aligned to the diffused regions S, Gi, and G2. Any misalignment can result in an electrical short circuit between a gate and a source. Such a design requires employing a critical alignment and manufacturing process for the purpose of staying within the desired margin of error and in order to reach a sufficiently high yield with the current state of the art. There is a need for a process with far less critical dimensional constraints.

SUMMARY OF THE INVENTION

A JFET device is formed on a semiconductor body comprising an active region for the junction field effect device. A drain region layer is formed below the lower portion of the active region. The top surface of the body is doped to provide a source region layer on the device. Gate trenches extend through the source region layer forming source regions therein. The gate trenches also extend partially through the epitaxial layer. The gate trenches have sidewalls and bottoms. Dielectric spacer layers cover the sidewalls of the gate trenches upon surfaces of the source layer and the epitaxial layer in the gate trenches. Self-aligned gate regions are formed at the bottoms of the gate trenches in doped portions of the active region.

Preferably, the drain region comprises a silicon semiconductor substrate having a <110> crystallographic orientation; the gate regions are self-aligned with the source regions; the trench etching has vertically extending sidewalls; the trenches were etched along a <111> crystallographic plane in the active region; and spacer layer comprises a thermal oxide formed on the sidewalls.

BRIEF DESCRIPTION OF THE DRAWINGS

The foregoing and other aspects and advantages of this invention are explained and described below with reference to the accompanying drawings, in which:

FIG. 1E shows a completed JFET device 10 made in accordance with the new JFET architecture and the new process of this invention.

FIG. 2 shows a top view of a device in accordance with this invention.

FIG. 3 shows a prior art surface gate JFET with semiconductor substrate with an N doped active region A formed above an N+ drain region D.

DESCRIPTION OF THE PREFERRED EMBODIMENT

Figure 1A:
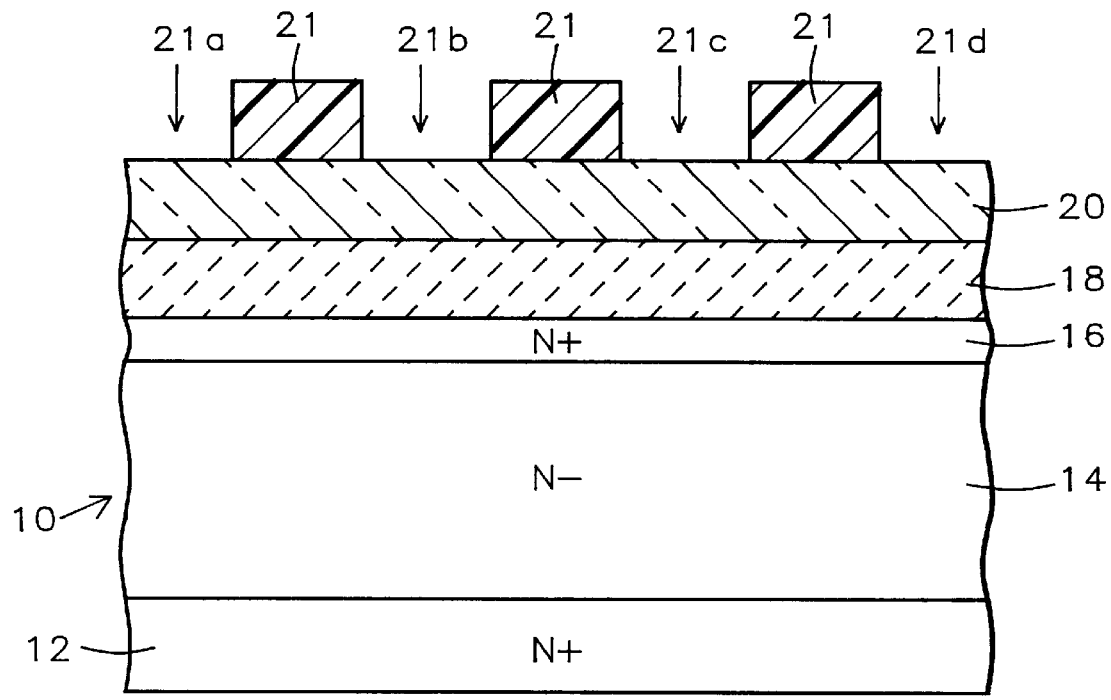
FIGS. 1A to 1E show the process steps for forming the device of FIG. 1E in accordance with this invention.
Figure 1B:
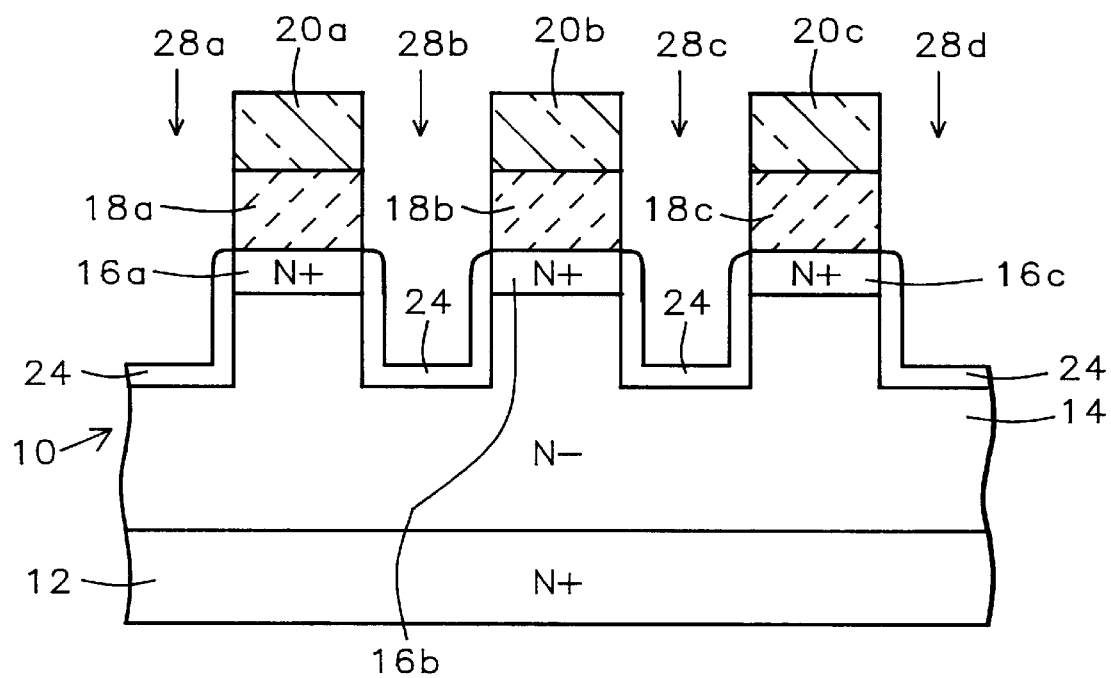
Figure 1C:
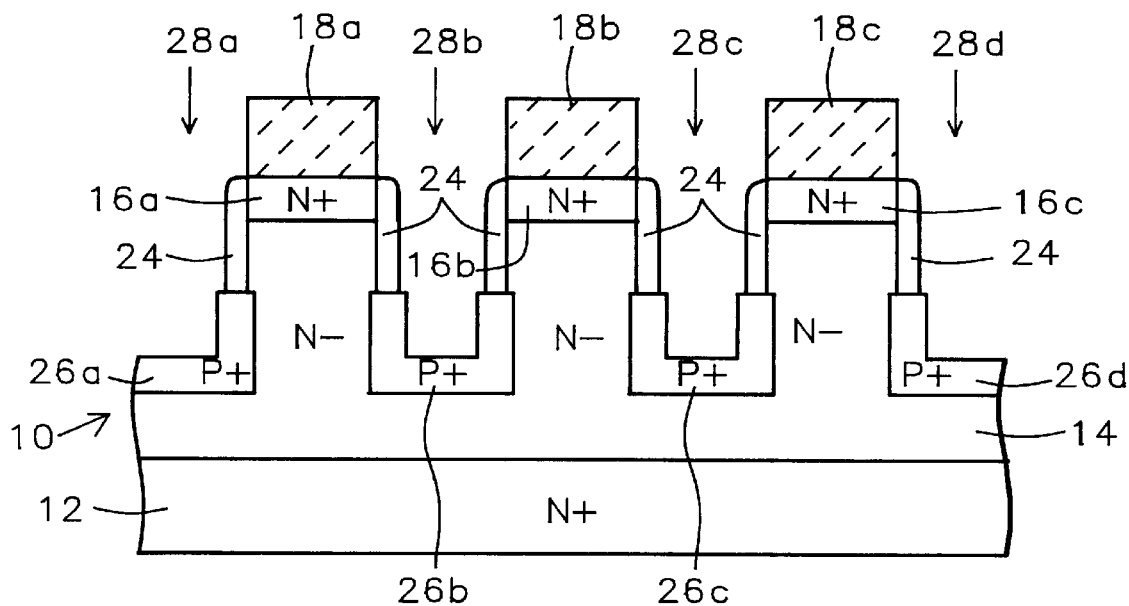
Figure 1D:
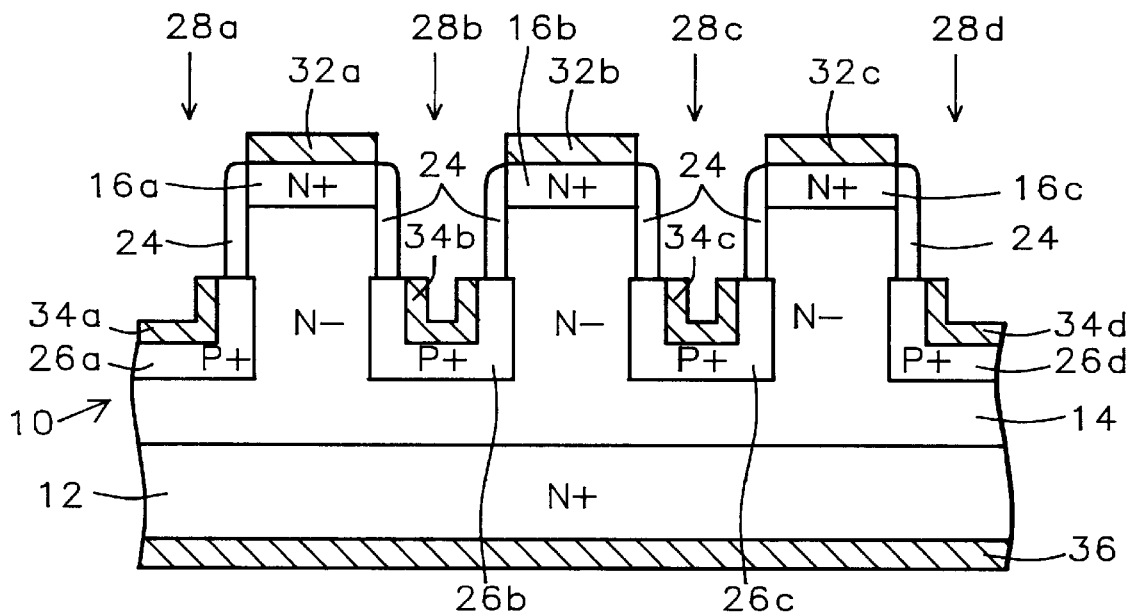
Figure 1E:
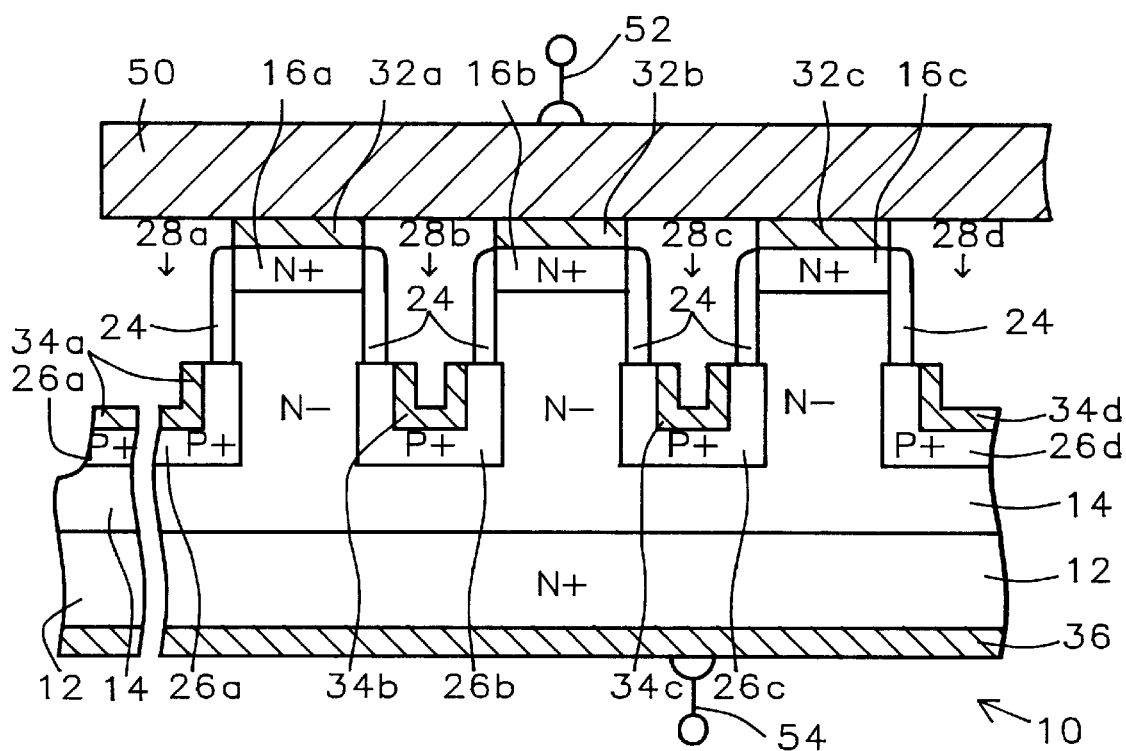

FIG. 1E shows a completed JFET device 10 made in accordance with the new JFET architecture and the new process of this invention. JFET device 10 is formed on a silicon semiconductor substrate the bulk of which is shown as an epitaxially deposited, N– doped active silicon layer 14 on an N+ silicon <110> crystallographic orientation substrate 12. On the top surface of the epitaxial layer 14 is formed a set of N+ doped source regions 16a, 16b and 16c which are separated by a series of trenches 28a–28d etched down into the N+ source layer and the N– doped, epitaxial layer 14.

The source regions 16a, 16b and 16c are connected to respective source region electrodes 32a, 32b and 32c which, in turn, are connected together through individual connections to the lower surface of electrical bus line plate 50, which is connected to terminal 52. The source electrodes 32a, 32b, 32c and 32d can be connected together for the purpose of providing high current as shown in FIG. 1E or they can be connected to independent and separate nodes for alternative applications.

Between the N+ doped source regions 16a, 16b and 16c the set of trenches 28a, 28b, 28b and 28d formed in the substrate extending down in epitaxial, N– doped active region 14 with dielectric spacers 24 lining the walls of the trenches 28a–28d.

A set of P+ doped gate regions 26a, 26b, 26c and 26d is formed with one in the bottom of each of the trenches 28a, 28b, 28c and 28d. The gate regions 26a, 26b, 26c and 26d have respective gate electrodes 34a, 34b, 34c and 34d formed on their surfaces at the bottom of the trenches 28a–28d. The gate electrodes 34a–34d can also be connected together to provide high current. As stated above, source electrodes 16a–16d have also been illustrated in the option of connection thereof to electrical bus line plate 50 to provide high current in the bus line 50 and in the attached conductor 52.

Below the epitaxial layer 14 is formed the N+ doped silicon, layer 12 formed in the substrate of device 10. Layer 12 serves as the drain region of the three JFET devices formed with the sources 16a–16c and the associated set of two gates 26a–26b, 26b–26c and 26c–26d respectively for each source region 28a–28c. The electrode 36 is connected to the bottom surface of the N+ doped silicon substrate 13 as the drain connection to line 54 which is the external drain terminal of all of the JFET transistors in the device 10 of FIG. 1E.

On the left end of the device of FIG. 1E, a portion 48 of device 10 is shown extending well beyond the end of electrical bus line plate 50. The portion 48 includes contact metallization layer 36, drain region 12, N– doped epitaxial layer 14, P+ gate electrodes 26a, and contact 34a extend to the left of the end of metal, electrical bus line plate 50. This design is employed since integrated circuit devices are etched and then cut in between device areas to separate them from other devices on the wafer.

Manufacturing Process

The manufacturing process of the invention requires only a single mask 21 seen in FIG. 1A which is formed on a polished surface of silicon dioxide layer 20.

When employing the process of this invention, no critical alignments are required and the architecture of the new JFET devices provides much greater protection against gate to source electrical short circuits. Accordingly device yield is enhanced significantly.

The process steps for forming the device of FIG. 1E are described below with reference to FIGS. 1A to 1E.

FIG. 1A shows an N+ doped silicon semiconductor substrate (drain region) 12 with an N– doped, epitaxial, silicon (active region) layer 14 formed thereon with a <110> crystallographic orientation lattice structure. For a 400 V device, the N– epitaxial layer 14 is preferably about 40 μm thick and N– epitaxial layer 14 contains dopant with a preferred concentration of 1 E 14 atoms/cm$^3$ (with a maximum range from about 1 E 14 atoms/cm$^3$ to about 5 E 14 atoms/cm$^3$). Substrates with N-epitaxial layers 14 are available on the market as commodities. Layer 12 will serve as the drain region of the JFET transistors as seen in FIGS. 1C, 1D and 1E.

Next an N+ layer 16 is formed on layer 14 by an N+ diffusion of phosphorus (P) or arsenic (As) dopant into layer 14. The dopant is diffused into layer 14 with a concentration from about 1 E 19 atoms/cm$^3$ to about 1 e 20 atoms/cm$^3$. The layer 16, which is formed for use as source regions as well as an ohmic contact, is less than one micrometer (<1 μm or 10,000 Å) thick (with a range of thicknesses from about 5,000 Å to about 7,000 Å. Instead of a diffusion, region 16 which can be formed by ion implantation with arsenic dopant.

The surface of layer 16 is coated with a silicon nitride (Si$_x$N$_y$) layer 18 deposited with a thickness from about 1,000 Å to about 3,000 Å.

Above the exposed surface of silicon nitride (Si$_x$N$_y$) layer 18, a silicon dioxide (SiO$_2$) layer 20 is deposited with a thickness from about 800 Å to about 1,200 Å.

A photoresist mask 21 with openings 21a, 21b, 21c, and 21d has been formed over the device 10 covering the silicon dioxide layer 20 in preparation for etching through the openings 21a–21d with the remainder of the device being protected by mask 21. Mask 21 is to be used in a one mask-photolithographic step which requires no alignment to form the gate by patterning through silicon dioxide layer 20 removing portions thereof between sections 20a–20c and silicon nitride layer 18 removing portions thereof between sections 18a, 18b, 18c. The layers 20 and 18 then comprise a self-aligned mask of silicon dioxide (SiO$_2$) and silicon nitride (Si$_x$N$_y$) which is used to pattern the remaining features of the device 10 in a series of self-aligned processing steps.

A self-aligned SiO$_2$/Si$_x$N$_y$ mask is formed over the device for use in a wet or dry plasma etching process is used to etch the silicon dioxide layer 20. The process used is a conventional process as will be well understood by those skilled in the art.

Etching of Trenches in Silicon Layers

FIG. 1B shows the product of FIG. 1A after etching through the self-aligned mask of silicon dioxide (SiO$_2$) layer 20 and silicon nitride (Si$_x$N$_y$) layer 18 to form the mask described above.

Subsequently, the mask formed of layers 18 and 20 is used during etching with either a standard plasma dry etching process with a gas such as CF$_4$ or with a wet solution of potassium hydroxide (KOH) to form an array of trenches 28a, 28b, 28c and 28d, etc. through layer 16 and deep down into layer 14. The trenches are etched to a relatively shallow depth (less than shown in the drawings) of from about 5 μm to about 8 μm in the layers 14 and 16.

Preferably, a first orientation etch is performed with an aqueous solution of KOH along a {111} crystallographic plane giving a vertical wall to trenches 28a, 28b, 28c and 28d, etc. While a wet etch with the aqueous solution of KOH is preferred, a dry plasma etch is a possible alternative.

After the first KOH etching a step follows of oxidation of the newly exposed surfaces in the trenches 28a, 28b, 28c and 28d of the newly exposed sidewall surfaces of N+ layer 16 and N-doped epitaxial layer 14. The result is the formation of silicon oxide sidewall and bottom layers 24 on the sidewalls and bottom the exposed surfaces of the N-doped epitaxial layer 14 and N+ layer 16 in the trenches 28a–28d. The sidewalls and bottoms 24 are formed by a thermal oxidation process which forms a layer with a thickness from about 800 Å to about 1,200 Å on the layers 14 and 18 in the trenches 28a, 28b, 28c and 28d, etc.

FIG. 1C shows the product of FIG. 1B after a step of reactive ion etching away the bottom portions of the spacer oxide layers 24 as well as etching away the silicon oxide on top of the source regions 16a, 16b and 16c with a process of dry anisotropic plasma etch using RIE (Reactive Ion Etching) with a typical etchant gas (a text book gas well known to those skilled in the art) to etch away the silicon dioxide at the bottom of the trenches 28a–28d and to etch away the oxide on top of the silicon nitride layers leaving spacers 24 in the trenches 28a, 28b, 28c and 28d, etc. This dry anisotropic, vertical etch of N doped epitaxial layer 14, which removes further material below the trenches 28a–28d from about 5 μm to about 8 μm in depth, which means that the trenches 28a–28d have an overall depth from about 10 μm to about 16 μm. A step of etching with CF$_4$ gas is used to etch the epitaxial layer 14.

Next follows an anisotropic, vertical etch using etching (either a dry plasma etch or a KOH wet etch) from about 5 μm to about 8 μm in depth. Preferably a step of etching with CF$_4$ gas is used for this etching step.

Then a P+ boron (B$^{11}$) ion diffusion is performed into portions of the N-epitaxial layer 14 is made below the spacers 24. The boron is diffused into trenches 28a–28d down into the exposed surface of the epitaxial layer 14 to form P+ gate regions 26a, 26b, 26b and 26d at the base of the trenches 28a–28d.

Note that the oxide layer on top has been removed and that the N+ layers 16 below Si$_3$N$_4$ layers 18 form source regions 16a ... Note also the self-alignment; as well as the P+ Boron[11] ion diffusion into portions of the N– epitaxial layer 14 below the spacers 24 in the base of trenches 28a, 28b, 28c and 28d and extending up along the sidewalls of the trenches 28a–28d towards the source regions 16a, 16b, and 16c so that the gate regions 26a, 26b, 26c and 26d extend up along the sidewalls of the trenches above the portions thereof formed at the base of trenches 28a, 28b, 28c and 28d.

FIG. 1D shows the product of FIG. 1C after removing the remaining silicon nitride films 18 from the top of the source regions 16a, 16b and 16c by, for example, wet etching with hot phosphoric acid ($H_3PO_4$) solution leaving the oxide sidewall spacers 24 from oxide layer 24.

Then a process of electroless plating with nickel and gold follows over the exposed N+ silicon layer 16 and epitaxial N doped silicon layer 14 to form self-aligned metal contacts in three separate locations. Contacts 34a, 34b, 34c and 34d are formed at the base of the trenches 28a, 28b, 28c and 28d on top of the gate regions 26a, 26b, 26c and 26d. Contacts 32a, 32b and 32c are formed on top of the source regions 16a, 16b and 16c. Contact metallization layer 36 is formed on the base of drain region 12.

Electroless Ni or Au, etc. were then coated by plating to form metal electrodes 32a, 32b, 32c and 32d on the source regions 16a–16d and electrodes 34a, 34b, 34c and 34d on the gate regions 26a–26d. In addition, electrical and mechanical contact is made to the back side using aluminum as drain (anode.)

Then conventional steps follow including using photoresist to protect circuit area and etch away other areas to form JFET devices. Then a metal plate 50 is connected by thermal bonding to Au or Ni metal in layers 32a–32d.

FIG. 2 shows a top view of a device in accordance with this invention. The device includes the N+ doped active region A, polysilicon P1, with the shaded layer of polysilicon P2 overlying portions of layer P1. An additional layer of polysilicon P1' is shown in contact with buried contact BC1. A contact X is provided between the polysilicon layer P1 and P2 where they are overlapped aside from the active region A at the top of FIG. 2. By including buried contact BC1, the advantages are as follows:

1) It is possible to reduce the number of polysilicon layers, and

2) A currently used double polysilicon SRAM process may be used with very little modification.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A junction field effect transistor device comprising:
   a substrate including an active region for said junction field effect device comprising an epitaxial layer of semiconductor material having a <110> crystallographic orientation, said active region for said junction field effect device having a top surface and having a lower portion, and said active region being doped with a first conductivity type of dopant,
   a drain region layer having a <110> crystallographic orientation formed below said lower portion doped with said first conductivity type of dopant to a higher level than said body of an epitaxial layer of said semiconductor material forming a drain region, said drain region layer having a lower surface,
   said top surface of said active region being doped with an additional amount of said first conductivity type of dopant to provide a source region layer on said top surface of said active region,
   a plurality of gate trenches extending through said source region layer forming source regions in said source region layer having exposed portions, and continuing said trench with said gate trenches extending partially through said active region, said trenches having sidewalls and bottoms,
   said trenches having a wall etched along a <111> crystallographic plane in said active region, said trenches having vertically extending sidewalls,
   a dielectric spacer layer over said sidewalls of said gate trenches upon surfaces of said source layer and said epitaxial layer in said gate trenches,
   a plurality of gate regions with one gate region at the bottom of each of said gate trenches in doped portions of said active region, and
   electrodes formed upon exposed surfaces of said source regions, said gate regions and said drain region.

2. A device in accordance with claim 1 wherein said spacer layer comprises a thermal oxide formed on said sidewalls.

3. A device in accordance with claim 1 wherein said gate regions are self-aligned with said source regions.

4. A device in accordance with claim 1 wherein:
   said gate regions are self-aligned with said source regions, and
   said spacer layer comprises a thermal oxide formed on said sidewalls of said trenches.

5. A junction field effect transistor device comprising:
   a drain region comprising a semiconductor substrate with an epitaxial layer of a semiconductor material having a <110> crystallographic orientation doped with a first conductivity type of dopant, said drain region having a top surface and a bottom surface,
   an active region for said junction field effect device coated on said top surface of said substrate, said active region comprising an epitaxial semiconductor layer having a <110> crystallographic orientation, said active region being doped in a lesser concentration than said drain region with said first conductivity type of dopant,
   a top portion of said active region doped with an additional amount of said first conductivity type of dopant providing a source region layer on the surface of said active region,
   a plurality of gate trenches extending through said source region layer forming separate source regions in said source region layer having been etched to provide an overall depth of said trenches from about 10 μm to about 16 μm,
   said plurality of gate trenches formed in an orientation having a wall etched along a {111} crystallographic plane, said trenches extending through said source region layer and said active region through gate trenches extending partially through said epitaxial layer, and said trenches having vertically extending sidewalls and having bottoms formed by etching through said source region layer and said epitaxial layer along said {111} crystallographic plane, dielectric spacer layers formed over the top portions of said sidewalls of said gate trenches upon exposed portions of said source region layer and said epitaxial layer in said gate trenches, a plurality of gate regions with one gate region at each of the bottoms of each of said gate trenches in the doped portions of said epitaxial layer by doping thereof, and electrodes formed upon exposed surfaces of said source regions, said gate regions and said drain region.

6. A device in accordance with claim 5 wherein said spacer layer comprises a thermal oxide formed on said sidewalls.

7. A device in accordance with claim 5 wherein:

said gate regions are self-aligned with said source regions.

8. A device in accordance with claim 5 wherein:

said gate regions are self-aligned with said source regions, and said spacer layer comprises a thermal oxide formed on said sidewalls.

9. A device in accordance with claim 5 wherein said trenches were formed by anisotropic etching.

10. A device in accordance with claim 5 wherein said spacer layers comprise a thermal oxide formed on said sidewalls of said trenches.

11. A device in accordance with claim 5 wherein:

said trenches were formed by anisotropic etching, and said spacer layers comprise a thermal oxide formed on said sidewalls of said trenches.

12. A junction field effect transistor device in accordance with claim 5 wherein:

said epitaxial semiconductor layer is about 40 $\mu$m thick, said epitaxial semiconductor layer is doped with a doping concentration of from about 1 E 14 atoms/cm$^3$ to about 5 E 14 atoms/cm$^3$, and said source region layer in the surface of said epitaxial layer being doped with an additional amount of said first conductivity type of dopant to provide a on the surface of said epitaxial layer with a doping concentration from about 1 E 19 atoms/cm$^3$ to about 1 E 20 atoms/cm$^3$.

13. A junction field effect transistor device comprising:

a drain region comprising a semiconductor substrate with a <110> crystallographic orientation doped with a N+ conductivity type of dopant to form said drain region, said drain region having a top surface and a bottom surface, an epitaxial semiconductor layer having a <110> crystallographic orientation formed on the surface of said drain region, an active region formed on said top surface of said drain region from epitaxial semiconductor layer, said active region being about 40 $\mu$m thick, and having a top surface, said active region being doped with a N− conductivity type of dopant doping concentration of from about 1 E 14 atoms/cm$^3$ to about 5 E 14 atoms/cm$^3$, said doping concentration being less than said drain region with said first conductivity type of dopant, a source region layer formed from said epitaxial semiconductor layer on the surface of said active region layer doped with an additional amount of said N conductivity type of dopant with a doping concentration of from about 1 E 19 atoms/cm$^3$ to about 1 E 20 atoms/cm$^3$, a plurality of gate trenches formed along the {111} crystallographic plane extending through openings in said source region layer forming source regions in said source region layer, and said gate trenches extending partially through said epitaxial layer, said trenches having vertically extending sidewalls comprising exposed portions of said source region layer and said epitaxial layer and having bottoms below said sidewalls, said N-doped epitaxial layer having been etched to provide an overall depth of said trenches from about 10 $\mu$m to about 16 $\mu$m, a dielectric spacers with a thickness from about 800 Å to about 1,200 Å comprising a thermal oxide on said sidewalls of said gate trenches extending to a depth in said trenches from about 5 $\mu$m to about 8 $\mu$m, a plurality of gate regions with one gate region formed at the each of the bottoms of each of said gate trenches doped by diffusion of P+ boron (B$^{11}$) into said epitaxial layer, said gate regions extending up along the sidewalls of said trenches above the portions thereof formed at the base of trenches to the lower end of said spacers, and contacts formed upon exposed surfaces of said source regions, said gate electrode regions and said drain region.

14. A device in accordance with claim 1 wherein:

said gate regions extend up along the sidewalls of said trenches above the portions thereof formed at the base of trenches.

15. A device in accordance with claim 1 wherein:

said spacer layer comprises a thermal oxide formed on said sidewalls, and said gate regions extend up along the sidewalls of said trenches above the portions thereof formed at the base of trenches.

16. A device in accordance with claim 1 wherein:

said gate regions are self-aligned with said source regions and said gate regions extending up along the sidewalls of said trenches above the portions thereof formed at the base of trenches.

17. A device in accordance with claim 1 wherein:

said gate regions extend up along the sidewalls of said trenches above the portions thereof formed at the base of trenches and said gate regions are self-aligned with said source regions, and said spacer layer comprises a thermal oxide formed on said sidewalls of said trenches.

18. A device in accordance with claim 5 wherein:

said N-doped epitaxial layer having been etched to provide an overall depth of said trenches from about 10 $\mu$m to about 16 $\mu$m, said gate regions extend up along the sidewalls of said trenches above the portions thereof formed at the base of trenches and, said gate regions are self-aligned with said source regions.

19. A device in accordance with claim 5 wherein:

said gate regions are self-aligned with said source regions, said gate regions extend up along the sidewalls of said trenches above the portions thereof formed at the base of trenches, and said spacer layer comprises a thermal oxide formed on said sidewalls.

20. A device in accordance with claim 17 wherein:

said spacer layer comprises a thermal oxide formed on said sidewalls of said trenches.

* * * * *